United States Patent
Saito et al.

(10) Patent No.: US 9,344,661 B2
(45) Date of Patent: May 17, 2016

(54) PHOTODETECTOR

(71) Applicant: KABUSHIKI KAISHA TOSHIBA, Tokyo (JP)

(72) Inventors: Nobuyoshi Saito, Tokyo (JP); Hideyuki Funaki, Tokyo (JP); Shunsuke Kimura, Kanagawa (JP); Shintaro Nakano, Kanagawa (JP); Go Kawata, Kanagawa (JP); Rei Hasegawa, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/682,173

(22) Filed: Apr. 9, 2015

(65) Prior Publication Data
US 2015/0296161 A1 Oct. 15, 2015

(30) Foreign Application Priority Data

Apr. 11, 2014 (JP) ................... 2014-082263

(51) Int. Cl.
| | | |
|---|---|---|
| *H01L 27/146* | (2006.01) | |
| *H04N 5/378* | (2011.01) | |
| *G01T 1/20* | (2006.01) | |
| *G01T 1/208* | (2006.01) | |
| *G01T 1/24* | (2006.01) | |
| *H01L 31/107* | (2006.01) | |

(52) U.S. Cl.
CPC ............... *H04N 5/378* (2013.01); *G01T 1/208* (2013.01); *G01T 1/248* (2013.01); *H01L 27/14607* (2013.01); *H01L 27/14636* (2013.01); *H01L 31/107* (2013.01)

(58) Field of Classification Search
CPC .............. G01T 1/208; H01L 27/14607; H01L 27/14636; H04N 5/378
See application file for complete search history.

(56) References Cited

U.S. PATENT DOCUMENTS

| | | | |
|---|---|---|---|
| 2008/0231339 A1* | 9/2008 | Deschamps | ........ H03K 17/0416 327/326 |
| 2009/0065704 A1 | 3/2009 | Heringa et al. | |
| 2011/0266420 A1 | 11/2011 | Eldesouki et al. | |

(Continued)

FOREIGN PATENT DOCUMENTS

| | | |
|---|---|---|
| EP | 2645131 | 10/2013 |
| JP | 2009-535821 | 10/2009 |

(Continued)

OTHER PUBLICATIONS

Extended European Search Report dated Sep. 9, 2015, for European Patent Application No. 15161044. (9 pgs.).

(Continued)

*Primary Examiner* — Mark R Gaworecki
(74) *Attorney, Agent, or Firm* — Finnegan, Henderson, Farabow, Garrett & Dunner, LLP

(57) ABSTRACT

According to an embodiment, a photodetector includes a plurality of photoelectric transducers, a plurality of resistors, and a plurality of resetting sections. Each of the photoelectric transducers is configured to output a detection signal resulting from conversion of received light into an electric charge. Each of the resistors is connected in series with an output end of a corresponding photoelectric transducer at one end of the resistor. Each of the resetting sections is connected in parallel with a corresponding resistor and configured to bring the output end of the corresponding photoelectric transducer to a reset level in response to the detection signal.

7 Claims, 4 Drawing Sheets

(56) References Cited

U.S. PATENT DOCUMENTS

| | | |
|---|---|---|
| 2013/0168535 A1 | 7/2013 | Eldesouki |
| 2013/0248720 A1 | 9/2013 | Kim et al. |
| 2014/0291486 A1 | 10/2014 | Nagano et al. |

FOREIGN PATENT DOCUMENTS

| | | |
|---|---|---|
| JP | 2011-003740 | 1/2011 |
| JP | 2013-89919 | 5/2013 |

OTHER PUBLICATIONS

S. Tisa et al., "On-chip Detection and Counting of Single-Photons," International Electronic Devices Meeting Dec. 5-7, 2005, IEEE (Dec. 5, 2005) pp. 815-818 (4 pgs.).

A. Rochas et al., "Actively recharged single photon counting avalanche photodiode integrated in an industrial CMOS process," Swiss Federal Institute of Technology, Institute of Microelectronics and Microsystems, CH-1015 Lausanne, Switzerland, Sensors and Actuators A,, vol. 110, No. 1-3 (Feb. 1, 2004) pp. 124-129. (6 pgs.).

* cited by examiner

A photon-counting CT apparatus according to a first embodiment reconstructs X-ray CT image data with a high SN ratio by using a photon-counting detector in counting the photons arising from an X-ray (X-ray photons) passed through a subject because each photon has a different energy, the photon-counting CT apparatus gains information of an X-ray energy component by measuring the energy level of each photon. The photon-counting CT apparatus collects a piece of projection data by driving an X-ray tube with one tube voltage, separates the projection data into a plurality of energy components, and generates an image using the energy components.

FIG. 1 illustrates a configuration of the photon-counting CT apparatus according to the first embodiment. As illustrated in FIG. 1, the photon-counting CT apparatus includes a gantry 10, a couch 20, and a console 30.

The gantry 10 includes an emission controller 11, an X-ray generator 12, a detector 13, a collector (data acquisition system (DAS)) 14, a rotating frame 15, and a driver 16. The gantry 10 emits an X-ray to a subject P, and measures the X-ray passed through the subject P.

The rotating frame 15 supports the X-ray generator 12 and the detector 13 in a manner facing each other with the subject P interposed therebetween. The rotating frame 15 is a circular frame that is driven to rotate at a high speed along a circular path about the subject P, by the driver 16 described later.

The X-ray generator 12 includes an X-ray tube 12a, a wedge 12b, and a collimator 12c. The X-ray generator 12 is a device that emits an X-ray to the subject P. The X-ray tube 12a is a vacuum tube caused to emit an X-ray to the subject P, by a high voltage supplied by the X-ray generator 12 described later. The X-ray tube 12a emits an X-ray beam to the subject

PHOTODETECTOR

CROSS-REFERENCE TO RELATED APPLICATION

This application is based upon and claims the benefit of priority from Japanese Patent Application No. 2014-082263, filed on Apr. 11, 2014; the entire contents of which are incorporated herein by reference.

FIELD

Embodiments described herein relate generally to a photodetector.

BACKGROUND

Silicon-based photomultipliers are now being actively developed, and improvements have also been made in systems for detecting extremely weak light using a scintillator and a photomultiplier. Development efforts aiming to achieve better performance are also underway. Above all, silicon photomultipliers (SiPMs), comprising an array of avalanche photodiode (APDs) each connected in series with a quenching resistor, are capable of achieving a high signal-to-noise (SN) ratio and a high dynamic range, and can be driven with a low voltage, and so many applications are anticipated.

An electric charge output from a photomultiplier is usually converted into a voltage by an integrator circuit, sampled and held, and then analog-to-digital (AD) converted. The acquired digital signal is then digital-signal processed, and put into histogram.

X-ray computed tomography (CT) apparatuses using photon counting are estimated to have a count rate of the X-ray incident on the scintillator of about $10^8$ counts per second, and therefore require a readout circuit that is capable of measuring high-speed data over several-hundreds of channels with a high energy resolution simultaneously.

With photon counting, the count rate is mostly lilted by the recovery time of the photomultipliers and the time required in AD conversion. While high performance AD converters have become available, it is still necessary to reduce the recovery time of the photomultipliers, in order to achieve measurements at a high count rate. One possible approach for achieving a shorter recovery time is to reduce the quenching resistance in the photomultiplier (SiPM), by reducing the CR time constant of the capacitor (C) and the resistor (R).

If the quenching resistance becomes too small, however, the photomultiplier might fall incapable of performing the quenching operation. This imposes a limitation in the reduction in the recovery time. Disclosed to alleviate this trade-off is active-quenching in active-quenching, transistors are used instead of the quenching resistors. Active quenching requires each APD to be connected in series with a transistor. To achieve a photoelectric transducer array, it is desirable for an APD to be integrated with a transistor, but high-voltage APDs cannot be easily integrated with low-voltage transistors. Furthermore, the APDs need to be ensured of an aperture ratio.

DETAILED DESCRIPTION

Figure 1:
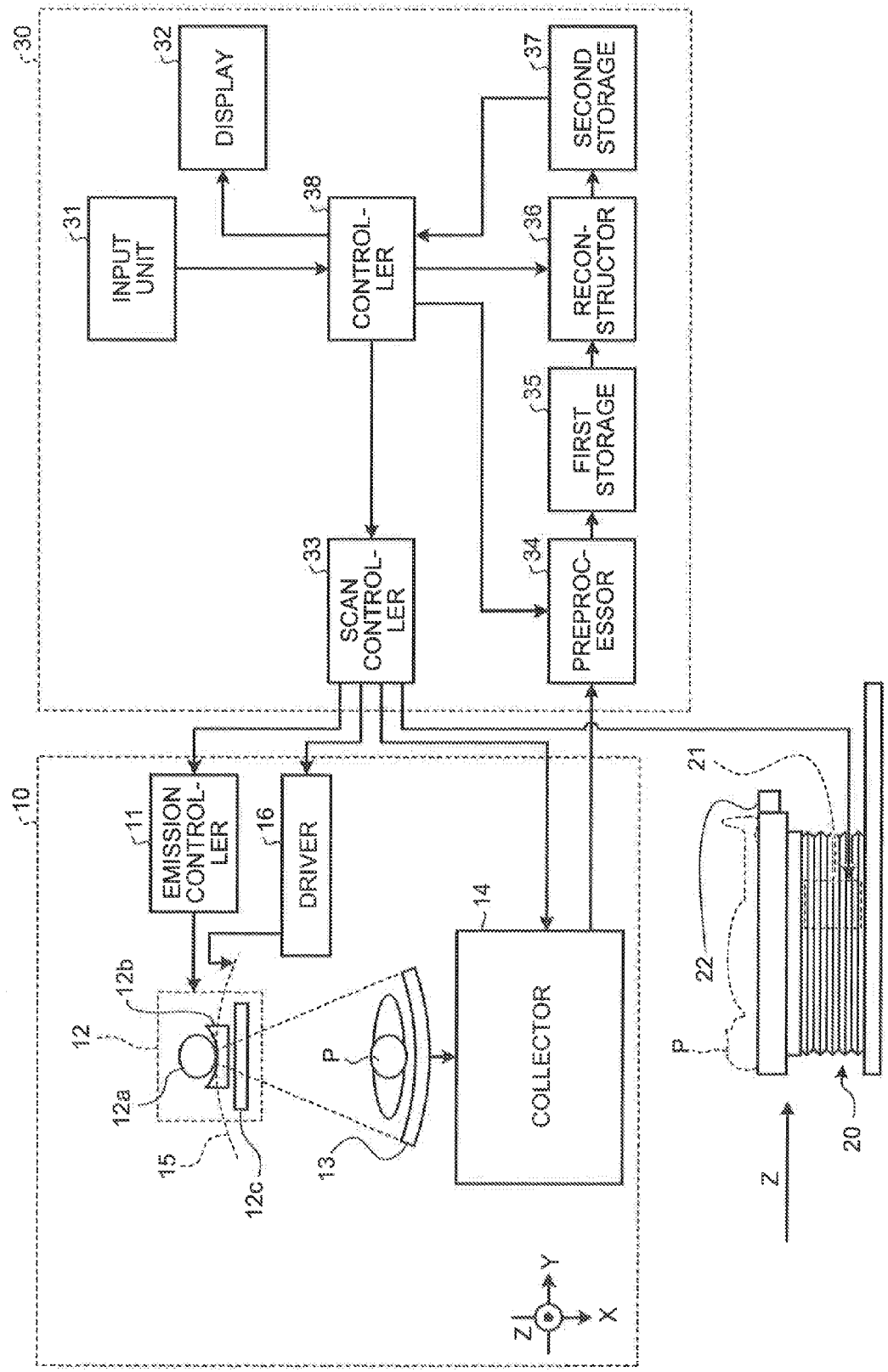
FIG. 1 is a schematic of a configuration of a photon counting CT apparatus according to a first embodiment.

According to an embodiment, a photodetector includes a plurality of photoelectric transducers, a plurality of resistors, and a plurality of resetting sections. Each of the photoelectric transducers is configured to output a detection signal resulting from conversion of received light into an electric charge. Each of the resistors is connected in series with an output end of a corresponding photoelectric transducer at one end of the resistor. Each of the resetting sections is connected in parallel with a corresponding resistor and configured to bring the output end of the corresponding photoelectric transducer to a reset level in response to the detection signal.

The following describes some embodiments of photon-counting computed tomography (CT) apparatus using a photodetector in detail with reference to the accompanying drawings.

First Embodiment

P while being rotated as the rotating frame 15 is rotated. The X-ray tube 12a generates an X-ray beam spreading at a fan angle and a cone angle.

The wedge 12b is an X-ray filter for adjusting the amount of X-ray emitted from the X-ray tube 12a. Specifically, the wedge 12b is a filter that passes and attenuates the X-ray emitted from the X-ray tube 12a so that the X-ray emitted from the X-ray tube 12a with which the subject P is irradiated has a predetermined distribution.

For example, the wedge 12b is a filter achieved by processing aluminum to a predetermined target angle and a predetermined thickness. The wedge is also referred to as a wedge filter or a bow-tie filter. The collimator 12c is a slit for limiting the area irradiated with the X-ray with its amount controlled by the wedge 12b, under the control of the emission controller 11 described later.

The emission controller 11 is a device that supplies a high voltage to the X-ray tube 12a as a high voltage generator, and the X-ray tube 12a generates an X-ray using a high voltage supplied by the emission controller 11. The emission controller 11 adjust the amount of X-ray with which the subject P is irradiated by adjusting a tube voltage and a tube current to be supplied to the X-ray tube 12a. The emission controller 11 also adjusts the range irradiated with an X-ray (the fan angle or the cone angle) by adjusting the aperture of the collimator 12c.

The driver 16 drives the rotating frame 15 in rotation, thereby causing the X-ray generator 12 and the detector 13 to rotate along the circular path about the subject P. Every time the detector 13 receives an X-ray photon, the detector 13 outputs a signal corresponding to the energy level of the X-ray photon. The X-ray photons are, for example, X-ray photons emitted from the X-ray tube 12a and passed through the subject P. The detector 13 includes a plurality of detecting elements each of which outputs a one-pulse electric signal (analog signal) every time an X-ray photon is incident. The number of X-ray photons being incident on each of the detecting elements can be counted by counting the number of electric signals (pulses). By performing a predetermined operation to the signal, the energy level of the X-ray photon resulted in the signal output can be measured.

Each of the detecting elements in the detector 13 includes a scintillator and a photosensor such as a silicon photomultiplier (SiPM). The detector 13 is configured as what is called an "indirect-conversion detector" in which the detector 13 converts an incident. X-ray photon into scintillator light, via the scintillator, and converts the scintillator light into an electric signal using a photosensor such as a photomultiplier. While what is called an "indirect-conversion detector" is provided as the detector 13 in this example, a "direct-conversion detector" that directly acquires a pulse of electric charge corresponding to the amount of incident X-ray, without using a scintillator or the like, may be provided.

Figure 2:
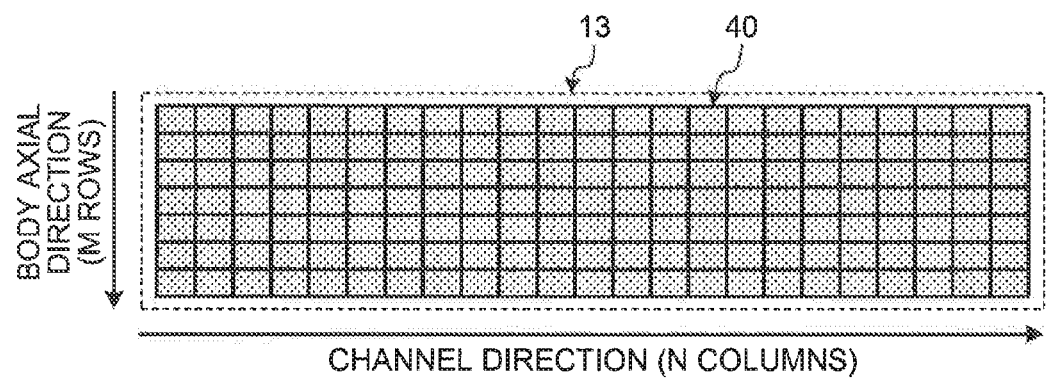
FIG. 2 is a plan view of a detector provided to the photon-counting CT apparatus according to the first embodiment.

FIG. 2 illustrates an example of the detector 13. The detector 13 is a surface detector in which detecting elements 40 each including a scintillator and a photosensor such as a photomultiplier are arranged in N columns in the channel direction (the Y-axial direction in FIG. 1), and in N rows in the body axial direction (in the Z-axial direction in FIG. 1). Each of the detecting elements 40 outputs a one-pulse electric signal for one incident photon. By distinguishing the pulses output from corresponding one of the detecting elements 40 from one another, the number of X-ray photons being incident on the corresponding detecting element 40 can be counted. The energy level of the counted X-ray photon can be measured by performing an operation based on the pulse intensity.

A circuit referred to as an analog front end for counting the outputs from each of the detecting elements 40 and supplying the outputs to the collector 14 illustrated in FIG. 1 is provided subsequent to the detector 13.

The collector 14 collects count information that is a result of counting the outputs from the detector 13. In other words, the collector 14 distinguishes the signals received from the detector 13 from one another, and collects the count information. The count in is a piece of information that can be acquired from a signal received from the detector 13 (detecting elements 40) every time an X-ray photon emitted from the X-ray tube 12a and passed through the subject P is incident. Specifically, the count information is information in which a count of X-ray photons being incident on the detector 13 (detecting elements 40) is associated with an energy level. The collector 14 transmits the collected count information to the console 30.

In other words, the collector 14 distinguishes the pulses received from each of the detecting elements 40 from one another, and collects a count of X-ray photons incident on the corresponding incident position (detected position) at the corresponding detecting element 40 and the energy level of the X-ray photons as count information, at each phase of the X-ray tube 12a (vacuum tube phase). The collector 14 uses the position of the detecting element 40 having output the pulse (electric signal) used in the counting, as the incident position, for example. The collector 14 also measures the energy level of the X-ray photons by performing a given operation to the electric signals.

The couch 20 illustrated in FIG. 1 is a device on which the subject P is laid, and includes a couch top 22 and a couch driving device 21. The couch top 22 is a table top on which the subject P is laid. The couch driving device 21 moves the couch top 22 in the Z-axial direction, thereby moving the subject P into the rotating frame 15.

The gantry 10 performs a helical scan for helically scanning the subject P, for example, by rotating the rotating frame 15 while moving the couch top 22. The gantry 10 may also perform a conventional scan in which the couch top 22 is moved, and then the subject P is fixed at one position and scanned along a circular path by causing the rotating frame 15 to rotate. The gantry 10 may also perform a step-and-shoot scan by moving the position of the couch top 22 at certain increments and performing a conventional scan across a plurality of respective scan areas.

The console 30 has the functions of an input unit 31, a display 32, a scan controller 33, a preprocessor 34, a first storage 35, a reconstructor 36, a second storage 37, and a controller 38. The console 30 receives operations of the photon-counting CT apparatus performed by an operator, and reconstructs an X-ray CT image using the count information collected by the gantry 10.

The input unit 31 transfers the information of various instructions and settings input by an operator operating a mouse, a keyboard, or the like on the photon-counting CT apparatus to the controller 38. For example, the input unit 31 receives information such as conditions for capturing X-ray CT image data, reconstructing conditions for reconstructing the X-ray CT image data, and image processing conditions for the X-ray CT image data from the operator.

The display 32 is a monitor device viewed by the operator. The display 32 displays X-ray CT image data, and graphical user interfaces (GUIs) for receiving various instructions, settings, and the like from the operator via the input unit 31, under the control of the controller 38.

The scan controller 33 controls the process of collecting count information performed by the gantry 10, by controlling the operations of the emission controller 11, the driver 16, the collector 14, and the couch driving device 21, under the control of the controller 38.

The preprocessor 34 generates projection data by applying corrections such as logarithmic transformation, offset correction, sensitivity correction, and beam hardening correction to the count information received from the collector 14.

The first storage 35 stores therein the projection data generated by the preprocessor 34. In other words, the first storage 35 stores therein projection data for reconstructing the X-ray CT image data (corrected count information).

The reconstructor 36 reconstructs the X-ray CT image data using the projection data stored in the first storage 35. The X-ray CT image data can be reconstructed using various techniques one example of which includes back projection. An example of the back projection includes filtered back projection (FBP). The reconstructor 36 also generates image data by performing various types of image processing to the X-ray CT image data. The reconstructor 36 stores the reconstructed X-ray CT image data and the image data generated as a result of such various types of image processing in the second storage 37.

The projection data generated from the count information acquired by the photon-counting CT apparatus includes the information of the X-ray energy having been attenuated by having passed through the subject P. The reconstructor 36 is therefore capable of reconstructing X-ray CT image data of a specific energy component, for example. The reconstructor 36 may also reconstruct a piece of X-ray CT image data for each of a plurality of energy components, for example.

The reconstructor 36 may also generate a plurality of pieces of X-ray CT image data each piece of which represents corresponding one of the energy components in a different color, by assigning a color representing the energy component to each pixel of the X-ray CT image data representing the energy component. The reconstructor 36 may also superimpose such pieces of X-ray CT image data into one piece of image data.

The controller 38 controls the entire photon-counting CT apparatus by controlling the operations of the gantry 10, the couch 20, and the console 30. Specifically, the controller 38 controls CT scans performed in the gantry 10 by controlling the scan controller 33. The controller 38 also controls the image reconstructing process and the image generating process performed by the console 30 by controlling the preprocessor 34 and the reconstructor 36. The controller 38 also controls to display various types of image data stored in the second storage 37 onto the display 32.

Figure 3:
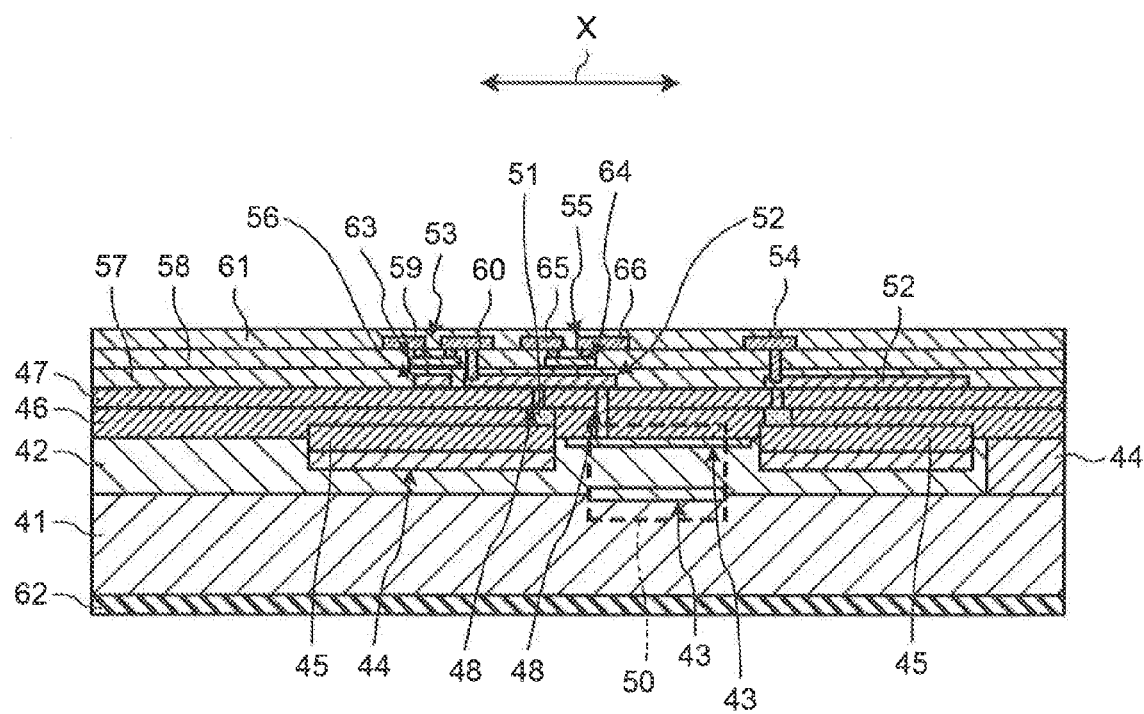
FIG. 3 is a cross-sectional view of a detecting element provided to the detector in the photon-counting CT apparatus according to the first embodiment.

FIG. 3 illustrates a cross-sectional view representing a detecting element 40 provided to the detector 13. Each of the detecting elements 40 includes, as an example of a photoelectric transducer, a plurality of avalanche photodiodes (APDs) 50, e.g., five in the column direction and five in the row direction, and 25 in total. The APDs 50 are fabricated in a bulk, by performing a semiconductor fabrication process to a semiconductor substrate. Specifically, to begin with, a p-type semiconductor layer 42 is epitaxially grown on an n-type semiconductor substrate 41. An impurity (such as boron) is then implanted so that the p-type semiconductor layer 42 is partially transformed into a p+ type semiconductor layer 43. In this manner, the APD is formed in plurality on the n-type semiconductor substrate 41. The length of each of the APDs 50 in the X direction illustrated in FIG. 3 that is the direction in which the APDs 50 are arranged (that is the channel direction in FIG. 2), or in the direction perpendicular to the X direction (that is, the body axial direction in FIG. 2) is 800 micrometers, for example.

The APDs 50 are then isolated from one another so that the APDs 50 do not electrically interfere with one another. This isolation is performed by providing a deep trench isolation structure, as an example, or a channel stopper structure achieved with phosphorus implantation, as another example, to the area between the APDs 50. Through this isolation, a channel stopper area 44 is formed between the APDs 50. This isolation is adjusted so that the area between the detecting element 40 and another detecting element 40 that are provided as a plurality of APDs 50 (that is, the inter-pixel areas between a pixel area and another pixel area) contains silicon (Si) on a surface of the p-type semiconductor layer 42, the side being a side nearer to a scintillator layer. In other words, the isolation is adjusted so that the channel stopper area 44 contains Si on the side nearer to the scintillator layer.

On the p-type semiconductor layer 42 on which the APDs 50 are formed, inactive regions 45 are provided in pairs in such a manner that the corresponding APD 50 is interposed between the two inactive regions 45, and are then covered with an insulating layer 46. A quenching resistor 51 that is used for passive quenching and is to be connected in series with the corresponding APD 50 is then formed on one of the inactive region pair 45. The quenching resistor 51 is an example of a resistor, and polysilicon, for example, is used for forming the quenching resistor 51. An insulating layer 47 is then provided, and a contact layer (contact hole) 48 for bringing the APD 50 and the quenching resistor 51 into conduction is provided. A first wiring layer 52 is then formed, and is brought into conduction with the quenching resistor 51 via the contact layer (contact hole) 48.

A reset thin-film transistor (TFT) 53 that is an example of a resetting section is then formed above the inactive region 45. The reset TFT 53 has a bottom-gate structure, as an example. An amplifier circuit 55 provided as a TFT that amplifies an output from the APD 50 with a predetermined gain and outputs the result is also formed, in addition to the reset TFT 53.

To explain specifically, to begin with, a gate electrode 56 of the reset TFT 53 and a gate electrode of the amplifier circuit 55 are formed at the same time as the first wiring layer 52 is formed. A gate insulating film 57 is then deposited. A silicon oxide film, a silicon nitride film, a silicon oxynitride film, an aluminum oxide, or a lamination thereof, for example, may be used as the gate insulating film 57. A semiconductor layer (channel layer 63) for the reset TFT 53 and a semiconductor layer (channel layer 64) for the amplifier circuit 55 are then deposited. At least the channel layer 63 of the reset TFT 53 is achieved with sputtering of oxide semiconductor containing one or more of indium (In), gallium (Ga), and zinc (Zn), for example. The channel layer 64 for the amplifier circuit 55 may, too, be achieved with sputtering of oxide semiconductor containing one or more of indium (In), gallium (Ga), and zinc (Zn), for example.

An etching protection film 58 is then deposited, and the structure is thermally treated at a temperature of 300 degrees Celsius to 500 degrees Celsius or so. The etching protection film 58 may contain a material such as a silicon oxide film, a silicon nitride film, a silicon oxynitride film, aluminum oxide, or a laminated structure thereof. The structure may be thermally treated in an atmosphere such as an inert atmosphere e.g., nitride, or in a mixed atmosphere that is an inert atmosphere containing oxygen or hydrogen.

Openings are then formed on the etching protection film 58 and the gate insulating film 57. A second wiring layer 54, a drain electrode 59 and a source electrode 60 of the reset TFT 53, and a drain electrode 65 and a source electrode 66 of the amplifier circuit 55 are then formed. The drain electrode 59 and the source electrode 60 of the reset TFT 53 are electrically connected to the respective ends of the passive-quenching resistor 51. In this manner, the parallel paths are achieved with the reset TFT 53, and the quenching operation is performed at a high speed. To the gate electrode 56 of the reset TFT 53, the output end of the amplifier circuit 55 is connected. In this manner, the reset TFT 53 is controlled to be driven the output of the amplifier circuit 55.

A passivation film 61 is then formed in the fabrication process of the reset TFT 53, a planarization process may be performed before the first wiring layer 52 is deposited, or before the semiconductor layer is deposited, for example. Examples of the planarization technique include chemical mechanical polishing, or reflow using a coating insulating film (e.g., spin-on-glass (BOG), boro-phospho silicate glass (BPSG), or phosphorus silicon glass (PSG)). The reset TFT 53 is explained to have a bottom-gate structure, but may have another structure such as a top-gate structure.

Finally, on the rear surface of the n-type semiconductor substrate 41, an electrode layer 62 is formed. The electrode layer 62 serves as a cathode electrode of the APD 50. Achieved with this process is a detector 13 provided with the active-quenching APDs 50 (detecting elements 40).

Figure 4:
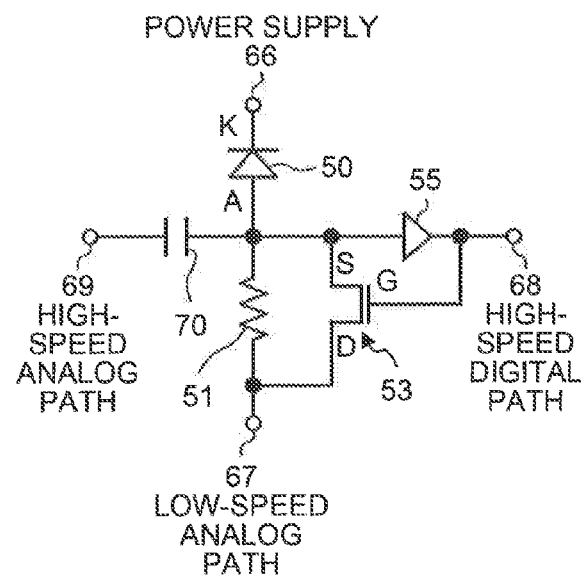
FIG. 4 is a block diagram of an electric charge signal readout circuit in the detector.

FIG. 4 illustrates a block diagram of the readout circuit for reading electric charges from the APD 50. As illustrated in FIG. 4, in the readout circuit, the APD 50 operating in a Geiger mode is connected in series to the passive-quenching resistor 51, and the active-quenching reset TFT 53 is connected in parallel with the quenching resistor 51. To an anode end A of the APD 50, the amplifier circuit 55 for amplifying photon signals is connected. The output end of the amplifier circuit 55 is connected to the gate G of the reset TFT 53. The source S of the reset TFT 53 is connected between a capacitor 70 and the amplifier circuit 55. A drain D of the reset TFT 53 is connected to the connection between an output terminal 67 for a low-speed analog path and the quenching resistor 51 (one side of the quenching resistor opposite to the APD 50). As a means for reading a high-speed analog signal, the capacitor 70 for removing a direct-current component is AC-coupled to the anode end A of the APD 50.

The readout circuit has a power supply terminal 66 for the APD 50, a power supply terminal (not illustrated) for the amplifier circuit 55, the output terminal 67 for the low-speed analog path, and an output terminal 68 for a high-speed digital path. In a configuration having an AC coupling capacitor 70, the readout circuit is also provided with an output terminal 69 for a high-speed analog path. These sum up to five or six terminals in total.

In such a readout circuit, when the APD 50 receives a photon, an electron-hole pair generated by photoelectric transducer is amplified in the APD 50, and the generated and amplified electric charge is charged in the depletion-layer capacity between the anode A and the cathode K of the APD 50. This immediately raises the electric potential at the anode end A of the APD 50. The electric charge generated by the quenching resistor 51 is converted into a current, and output as an analog pulse with a discharge time constant of the quenching resistor 51 and the depletion-layer capacity, via the output terminal 67 for the low-speed analog path and the output terminal 69 for the high-speed analog path. Because the output terminal 69 for the high-speed analog path is AC-coupled with the capacitor 70, the analog pulse output via the output terminal 69 for the high-speed analog path has only the high-frequency component of the analog pulse.

The amplifier circuit 55 amplifies the electric potential at the anode end A of the APD 50, and outputs a power level signal (High level as a digital value) via the output terminal 68 for the high-speed digital path. This output from the amplifier circuit 55 is fed-back to the gate G of the reset TFT 53. This drives the reset TFT 53 to perform the resetting operation. When the reset TFT 53 performs the resetting operation, the electric charge at the anode end A of the APD 50 can be discharged at a shorter time constant than the discharge time constant of the quenching resistor 51 and the depletion-layer capacity.

When the anode end A of the APD 50 is completely discharged, the anode end A is brought to a reset level, and the output from the amplifier circuit 55 is also reset to the GND level (Low level as a digital value). In this manner, the APD 50 can be reset more quickly, with a time constant shorter than the discharge time constant of the quenching resistor 51 and the depletion-layer capacity of the APD 50.

As may be clear from the description above, for the photon-counting CT apparatus according to the first embodiment, the quenching resistor 51 and the reset TFT 53 are levered above the APD 50, and the reset TFT 53 is driven by the output from the APD 50. Therefore, a high-speed quenching operation in which the APD 50 is reset more quickly with a time constant shorter than discharge time constant of the quenching resistor 51 and the depletion-layer capacity of the APD 50 can be performed, so that extremely weak light can be measured with a high count rate. The extremely weak light is irradiation of "$10^{10}$ counts per second" or so, as an example.

Second Embodiment

The following describes a photon-counting CT apparatus according to a second embodiment. In the photon-counting CT apparatus according to the second embodiment, the date electrode of the reset TFT 53 is formed using the same material as the passive-quenching resistor so that the process of producing the first wiring layer 52 is omitted.

Figure 5:
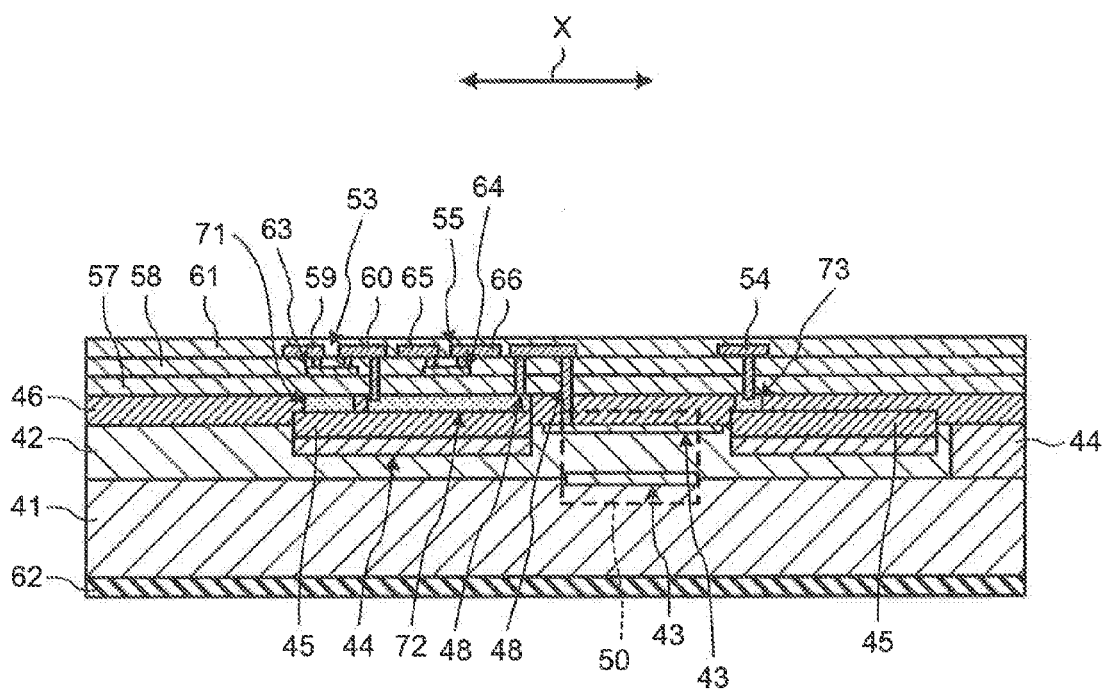
FIG. 5 is a cross-sectional view of a detecting element provided to a detector in a photon-counting CT apparatus according to a second embodiment.

FIG. 5 illustrates a cross-sectional view of a detecting element 40 provided to the detector 13 in the photon-counting CT apparatus according to the second embodiment. Each of the detecting elements 40 includes a plurality of APD 50 fabricated in a bulk, by performing a semiconductor fabrication process to a semiconductor substrate, as mentioned earlier. Specifically, to begin with, a p-type semiconductor layer 42 is epitaxially grown on an n-type semiconductor substrate 41. An impurity (such as boron) is then implanted so that the p-type semiconductor layer 42 is partially transformed into a p+ type semiconductor layer 43. Through this process, a plurality of APDs 50 are formed on the n-type semiconductor substrate 41.

The APDs 50 are then isolated from one another so that the APDs 50 do not electrically interfere with one another, by providing a deep trench isolation structure, as an example, or a channel stopper structure achieved with phosphorus implantation, as another example, to the area between the APDs 50. Through this isolation, a channel stopper area 44 is formed between the APDs 50. This isolation is adjusted so that the area between the detecting element 40 and another detecting element 40 that are provided as a plurality of APDs 50 (that is, the inter-pixel area between a pixel area and another pixel area) contains silicon (Si) on a surface of the p-type semiconductor layer 42, the side being a side nearer to the scintillator layer. In other words, the isolation is adjusted so that the channel stopper area 44 contains Si on the side nearer to the scintillator layer.

On the p-type semiconductor layer 42 on which the APDs 50 are formed, inactive regions 45 are provided in pairs in such a manner that the corresponding APD 50 is interposed between the two inactive regions 45, and are then covered with the insulating layer 46. A gate electrode 71 of the reset TFT 53 is then formed with polysilicon on the inactive region 45, for example, and resistor layers 72 and 73 serving as the passive-quenching resistor as well as the first wiring layer 52 described above are then formed with the same polysilicon. The resistor layer 72 is connected in series with the APD 50.

The gate insulating film 57 is then deposited. A silicon oxide film, a silicon nitride film, a silicon oxynitride film, an aluminum oxide, or a lamination thereof, for example, may be used as the gate insulating film 57. After the gate insulating film 57 is deposited, the contact layer (contact hole) 48 is provided, and the APD 50 is brought into conduction with the resistor layer 72.

The reset TFT 53 is then formed above the inactive region 45. The reset TFT 53 has a bottom-gate structure, as an example. The amplifier circuit 55 provided as a TFT that amplifies an output from the APD 50 at a predetermined gain and outputs the result is also formed, in addition to the reset TFT 53.

To explain specifically, to begin with, the gate electrode 71 of the reset TFT 53, the resistor layers 72 and 73, and the gate electrode of the amplifier circuit 55 are formed. The etching protection film 58 is then deposited, and the structure is thermally treated at a temperature of 300 degrees Celsius to 500 degrees Celsius or so. The etching protection film 58 may contain a material such as a silicon oxide film, a silicon nitride film, a silicon oxynitride film, aluminum oxide, or a laminated structure thereof. The structure may be thermally treated in an atmosphere such as an inert atmosphere, e.g., nitride, or in a mixed atmosphere that is an inert atmosphere containing oxygen or hydrogen.

Openings are then formed on the etching protection film 58, and the semiconductor layer (channel layer 63) of the reset TFT 53 and a semiconductor layer (channel layer 64) of the amplifier circuit 55 are formed. At least the channel layer 63 of the reset TFT 53 is achieved with sputtering of oxide semiconductor containing one or more of indium (In), gallium (Ga), and zinc (Zn), for example. The channel layer 64 for the amplifier circuit 55 may, too, be achieved with sputtering of oxide semiconductor containing one or more of indium (In), gallium (Ga), and zinc (Zn), for example.

Openings are then formed on the etching protection film 58. The second wiring layer 54, the drain electrode 59 and the source electrode 60 of the reset TFT 53, and the drain electrode 65 and the source electrode 66 of the amplifier circuit 55 are then formed. The drain electrode 59 and the source electrode 60 of the reset TFT 53 are electrically connected to the respective ends of the passive-quenching resistor layer 72. In this manner, the parallel paths are achieved with the reset TFT 53, and the quenching operation is performed at a high speed. To the gate electrode 71 of the reset TFT 53, the output end of the amplifier circuit 55 is connected. In this manner, the reset TFT 53 is controlled to be driven by the output of the amplifier circuit 55.

The passivation film 61 is then formed. In the fabrication process of the reset TFT 53, the planarization process may be performed before the semiconductor layer is deposited, for example. Examples of the planarization technique include chemical mechanical polishing, or reflow using a coating insulating film (e.g., SOG, BPSG, or PSG). The reset TFT 53 is explained to have a bottom-gate structure, but may have another structure such as a top-gate structure.

Finally, on the rear surface of the n-type semiconductor substrate 41, an electrode layer 62 is formed. The electrode layer 62 serves as a cathode electrode of the APD 50. Achieved with this process is a detector 13 provided with the active-quenching APDs 50 (detecting elements 40).

In the photon-counting CT apparatus according to the second embodiment, for example, polysilicon is used for forming the gate electrode 71 of the reset TFT 53, and the same polysilicon is used for forming the resistor layers 72 and 73 serving as the passive-quenching resistor as well as the first wiring layer 52 described above. In this manner, the gate electrode 71 of the reset TFT 53 and the quenching resistor (resistor layer 72) can be produced in the same process, and the process of fabricating the first wiring layer 52 (see FIG. 3) can be omitted, in addition to the same advantageous effects achieved with the first embodiment.

Third Embodiment

The following describes a photon-counting CT apparatus according to a third embodiment. The photon-counting CT apparatus according to the third embodiment is provided with a readout circuit that counts the number of incident photons and outputs the result digitally, as a readout circuit that reads the electric charge from the APD 50. Because the only difference between the third embodiment described below and the other embodiments described above is the readout circuit, only the readout circuit representing the difference will be explained below, and redundant explanations are omitted.

Figure 6:
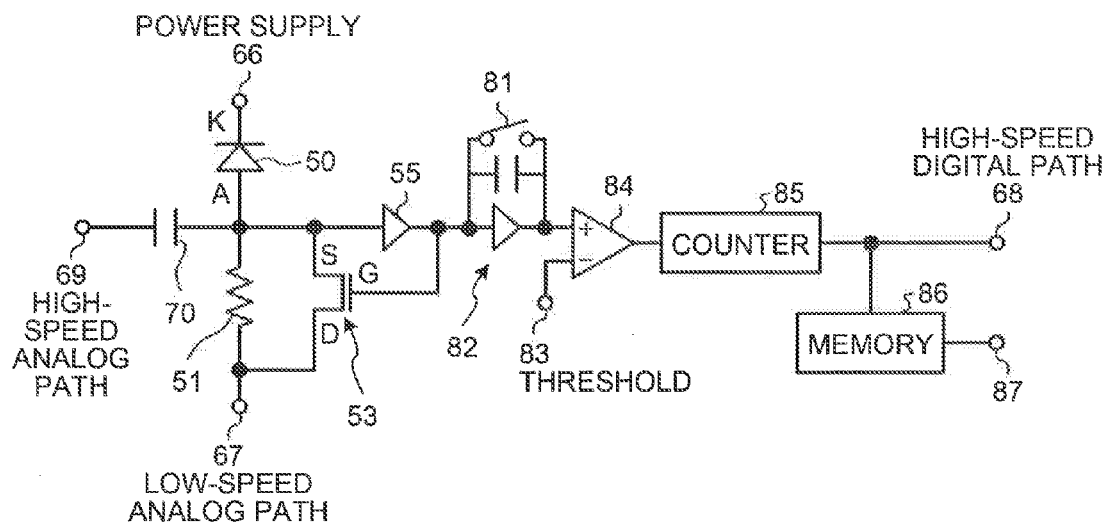
FIG. 6 is a block diagram of an electric charge signal readout circuit provided to a detector in a photon-counting CT apparatus according to a third embodiment.

FIG. 6 illustrates a block diagram of the readout circuit for reading electric charges from the APDs 50, the readout circuit being provided to the photon-counting CT apparatus according to the third embodiment. The parts exhibiting the same operations as those in the readout circuit explained in the first embodiment (see FIG. 4) are assigned with the same reference numerals in FIG. 6. As one can see in FIG. 6, the photon-counting CT apparatus according to the third embodiment includes an integrator circuit 82 that includes a reset switch 81, a comparator 84, a counter 85, and a memory 86.

The reset switch 81 performs a resetting operation at a predetermined measurement interval. The integrator circuit 82 calculates an integration of outputs from the amplifier circuit 55 over a period from when the reset switch 81 performs a resetting operation to when the reset switch 81 performs another resetting operation (that is the measurement interval), and supplies the result to the comparator 84. The comparator 84 digitizes the X-ray detection output detected by the APD 50 by comparing a threshold input via a threshold input terminal 83 with the integration output from the comparator 84. The comparator 84 outputs the comparison output of a High level (1) during the period in which the integration output is equal to or more than the threshold, and outputs a comparison output of a Low level (0) during the period in which the integration output is less than the threshold.

The counter 85 counts the number of comparison outputs of the High level. The counter 85 outputs the count via the output terminal 68 for the high-speed digital path. The counter 85 also supplies the count to a register or the memory 86 provided as a static random access memory (SRAM), for example. The memory 86 stores therein the count. The count stored in the memory 86 is read based on reading control of the controller 38 illustrated in FIG. 1, and is output via the output terminal 87.

The photon-counting CT apparatus according to the third embodiment is capable of counting and outputting the photon count digitally. Furthermore, the number of photon incidence events can be stored for each of the APDs 50, in addition to the advantageous effects achieved with the embodiments described above.

Figure 7:
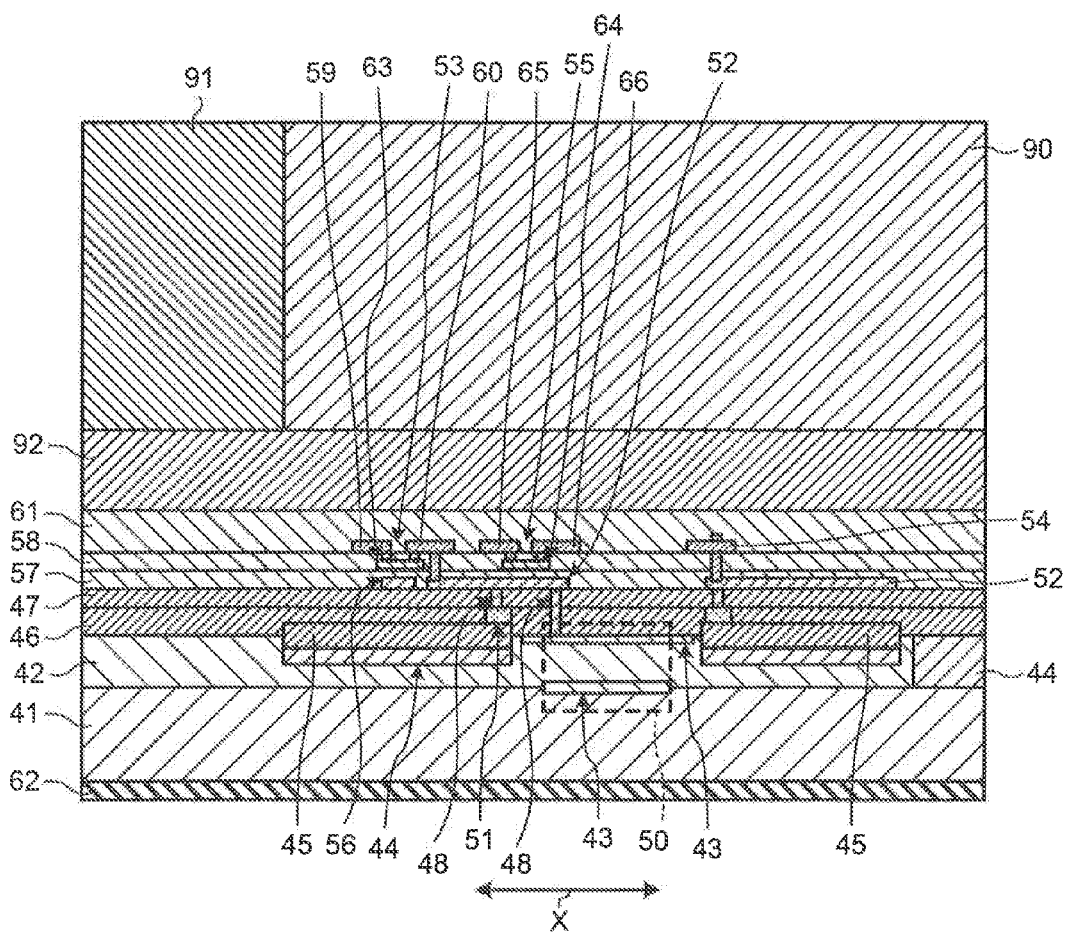
FIG. 7 is a cross-sectional view of the detector combined with a scintillator.

Finally, FIG. 7 illustrates a cross-sectional view of the detector 13 in which the detecting element is combined with a scintillator. In FIG. 7, a scintillator layer 90 is divided with reflective members 91 into areas corresponding to pixel areas. The length of each of the pixel areas of the scintillator layer 90 divided by the reflective members 91 in the direction in which the pixel areas are arranged (X direction) is, for example, 900 micrometers. The width of each of the opposite surfaces of the reflective member 91 is, for example, 100 micrometers.

The scintillator layer 90 separated into areas that are brought into close contact with the respective pixel areas by the reflective members 91 are bonded to the passivation film 61 with an adhesive layer 92 interposed therebetween. The thickness of the adhesive layer 92 is, for example, 50 micrometers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photodetector comprising:
   a plurality of photoelectric transducers, each configured to output a detection signal resulting from conversion of received light into an electric charge;
   a plurality of resistors each connected to an output end of a corresponding photoelectric transducer in series; and
   a plurality of resetting sections each connected in parallel with a corresponding resistor and configured to bring the output end of the corresponding photoelectric transducer to a reset level in response to the detection signal,
   wherein each of the resetting sections is configured as a thin-film transistor in which a source and a gate are connected to the output end of the corresponding photoelectric transducer and a drain is connected to the other end of the corresponding resistor.

2. The photodetector according to claim 1, wherein each of the photoelectric transducers is configured as an avalanche photodiode that operates in a Geiger mode with a reverse-bias voltage equal to or more than a breakdown voltage.

3. The photodetector according to claim 1, wherein
   each of the photoelectric transducers includes a plurality of elements that are provided on a semiconductor substrate of a first conductive type, each of the elements being provided as a semiconductor region of a second conductive type that outputs a detection signal resulting from conversion of light that is received on a semiconductor surface into an electric charge,
   each of the resistors is formed outside of an area where the light is received on the semiconductor substrate, the each resistor being disposed via an insulating film,
   each of the photoelectric transducers and the corresponding resistor are connected by a first wiring layer formed above the each photoelectric transducer and the corresponding resistor,
   the thin-film transistor is configured to use the first wiring layer as a bottom-gate electrode with an oxide film interposed therebetween, the source and the drain of the thin-film transistor are brought into contact by a second wiring layer that is deposited on the thin-film transistor and is connected to the first wiring layer; and
   the second wiring layer is covered with an insulating protection layer deposited on the second wiring layer.

4. The photodetector according to claim 1, wherein
   the resistors contain polycrystalline semiconductor or thin-film metal, and
   the thin-film transistor is produced from oxide semiconductor containing one or more of indium, gallium, and zinc.

5. The photodetector according to claim 1, wherein the gate of the thin-film transistor and the resistors contain a same resistor material.

6. The photodetector according to claim 1, further comprising:
   a digital converter configured to output digitized detection data of the detection signal, by outputting a result of comparison between the detection signal from each of the photoelectric transducers and a predetermined threshold; and
   a memory configured to store the detection data from the digital converter and output the detection data in accordance with reading control.

7. The photodetector according to claim 1, further comprising a scintillator configured to convert incident light into scintillator light to cause the scintillator light to be received on the photoelectric transducer.

* * * * *